US008672531B2

(12) United States Patent
Stoyan

(10) Patent No.: US 8,672,531 B2
(45) Date of Patent: Mar. 18, 2014

(54) LED SYSTEM, LED LAMP AND METHOD FOR ASSEMBLING A LED SYSTEM

(75) Inventor: Harald Stoyan, Rettenbach (DE)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 654 days.

(21) Appl. No.: 12/275,468

(22) Filed: Nov. 21, 2008

(65) Prior Publication Data
US 2009/0141493 A1 Jun. 4, 2009

(30) Foreign Application Priority Data
Nov. 30, 2007 (DE) .......................... 10 2007 057 765

(51) Int. Cl.
*H01R 33/00* (2006.01)
(52) U.S. Cl.
USPC ........................................... 362/652; 362/647
(58) Field of Classification Search
USPC ............................. 362/647, 652–659
See application file for complete search history.

(56) References Cited

U.S. PATENT DOCUMENTS

| 4,994,944 | A | * | 2/1991 | Vernondier | 362/239 |
| 5,829,865 | A | * | 11/1998 | Ahroni | 362/657 |
| 6,328,593 | B1 | | 12/2001 | Chang et al. | |
| 6,386,733 | B1 | * | 5/2002 | Ohkohdo et al. | 362/249.06 |
| 7,201,511 | B2 | * | 4/2007 | Moriyama et al. | 362/646 |
| 7,442,070 | B2 | * | 10/2008 | Lee | 439/417 |
| 7,527,391 | B2 | * | 5/2009 | Wu | 362/257 |
| 2004/0190290 | A1 | * | 9/2004 | Zerphy et al. | 362/226 |
| 2004/0252501 | A1 | * | 12/2004 | Moriyama et al. | 362/238 |
| 2006/0126338 | A1 | * | 6/2006 | Mighetto | 362/294 |
| 2007/0025103 | A1 | * | 2/2007 | Chan | 362/235 |
| 2008/0062688 | A1 | * | 3/2008 | Aeling et al. | 362/241 |

FOREIGN PATENT DOCUMENTS

| DE | 20017947 U1 | 3/2001 |
| DE | 10025449 A1 | 12/2001 |
| DE | 10234395 A1 | 2/2004 |
| DE | 202005006643 U1 | 10/2005 |
| DE | 102005044482 A1 | 4/2007 |
| WO | 02097770 A2 | 12/2002 |
| WO | 2005091973 A2 | 10/2005 |

OTHER PUBLICATIONS

English language abstract for DE 20 2005 006 643 U1.
English language abstract for DE 10 2005 044 482 A1.
English language abstract for DE 102 34 395 A1.
English language abstract for DE 100 25 449 A1.

* cited by examiner

Primary Examiner — David J Makiya

(57) ABSTRACT

The LED system has a set consisting of multiple LED lamps and an integrally formed electrical connecting member common to the LED lamps, wherein the electrical connecting member has multiple connection points for contacting a respective LED lamp.

9 Claims, 6 Drawing Sheets

LED SYSTEM, LED LAMP AND METHOD FOR ASSEMBLING A LED SYSTEM

CROSS-REFERENCE TO RELATED APPLICATIONS

This application claims priority to German Patent Application No. 10 2007 057 765.8 filed Nov. 30, 2007, the contents of which is incorporated herein by reference in its entirety.

TECHNICAL FIELD

The invention relates to a LED system, in particular to a LED chain, a LED lamp for use with such a LED system and a method for assembling a LED system.

BACKGROUND

Up to now customers receive application specific LED systems with an aligned, fixed preset LED pitch. Particularly, linear LED structures ('LED chains') are available in the market place in a plurality of forms and typically comprise multiple LED lamps which are connected to one another via electrical connections of predetermined length, such as leads, for example using solder contacts. For each customer not being able to find a suitable LED chain a new product has to be designed and adapted, respectively.

SUMMARY

According to various embodiments, an LED system, in particular an LED system or rather an LED chain of serially arranged LED lamps can be provided with variably definable LED positions, which in particular may be assembled at the end customer site, preferably using simple means.

According to an embodiment, an LED system may have a set consisting of multiple LED lamps and an integrally formed electrical connecting member common to the LED lamps, wherein the electrical connecting member comprises multiple connection points for contacting a respective LED lamp.

According to a further embodiment, the electrical connecting member may comprise a wire lead, in particular a ribbon cable, and at least one LED lamp comprises a disconnect/contacting connection, in particular a crimp/cut connection, for connecting the wire lead. According to a further embodiment, the crimp/cut connection may comprise a disconnecting member for disconnecting a conductor of the wire lead and two contact clamps arranged on both sides thereof for contacting the disconnected conductor. According to a further embodiment, the crimp/cut connection may be formed for connecting to a supply line of the wire lead. According to a further embodiment, the LED system may further comprise at least one end piece with a crimp connection for connecting two supply lines of the wire lead. According to a further embodiment, the electrical connecting member may comprise at least one electrical conductor formed on a circuit board, wherein the connection points are formed as contacts on the at least one electrical conductor. According to a further embodiment, the connection points can be formed as respective contacts on both sides of a conductor disruption, in particular of a supply line. According to a further embodiment, connection points of a conductor not contacted by a LED lamp may be bridgeable by means of a electrical jumper. According to a further embodiment, the connection points can be positioned in a supply line and the LED system comprises a further supply line, wherein a end piece connects the two supply lines.

According to another embodiment, an LED lamp may comprise a disconnect/contacting connection, in particular a crimp/cut connection, for connecting to a wire lead, in particular a ribbon cable.

According to a further embodiment, the crimp/cut connection may comprise a disconnecting member for disconnecting at least one conductor of the wire lead and two contact clamps arranged on both sides thereof for contacting the disconnected conductor.

According to another embodiment, a method for assembling a LED system, in particular a LED chain, comprising at least one integrally formed electrical connecting member and multiple LED lamps, may comprise the following steps: —selecting a connection position for a LED lamp on the electrical connecting member; and—connecting a LED lamp at the selected connection position on the electrical connecting member.

According to a further embodiment, the electrical connecting member may comprise a wire lead, in particular a ribbon cable, and at least one LED lamp comprises a contacting/disconnecting connection, in particular a crimp/cut connection, wherein the step of connecting the at least one LED lamp at the selected connection position comprises disconnecting of a conductor of the wire lead and contacting of the LED lamp on both sides of the disconnection point. According to a further embodiment, the electrical connecting member may comprise a circuit board with a electrical conductor formed thereon, wherein the connection points are formed as contacts on the at least one electrical conductor and the step of selecting a connection position for a LED lamp at the electrical connecting member comprises selecting one of multiple predefined connection points. According to a further embodiment, the method may further comprise the step of: —bridging of open connection points not connected to LED lamps.

BRIEF DESCRIPTION OF THE DRAWINGS

By means of the following exemplary embodiments the present invention will be schematically described in more detail.

DETAILED DESCRIPTION

Figure 1:
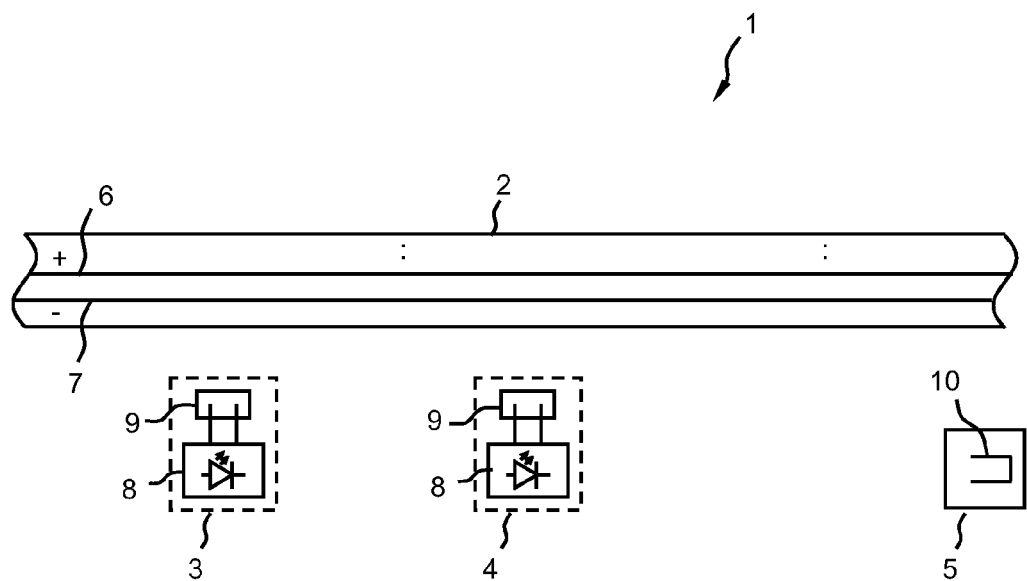
FIG. 1 sketchily shows components of a LED chain according to a first embodiment.

The LED system comprises a set of multiple LED lamps and a integrally formed electrical connecting member common to the LED lamps, wherein the electrical connecting member comprises multiple connection points for contacting a respective LED lamp.

The LED lamps may be formed as single LEDs or as a LED-cluster consisting of multiple coactive LEDs. The LED clusters may be formed as a group of monochrome LEDs or of LEDs emitting differing colors.

The common integrally formed electrical connecting member may for example comprise a common wire lead or a common circuit board. By contrast, the LED lamps of linear LED chains are up to now connected to each other via separate leads, for example.

The electrical connecting member comprises multiple connection points for contacting a respective LED lamp. For this reason a selection is possible at which position a LED lamp is to be connected. Thus, a distance of the LED lamps to each other is adjustable. Depending on the arrangement of the contacting, the LED lamp connected to the electrical connecting member may either be relocatable or remain at its position to fulfill the function of the LED system.

Preferably, the LED system may comprise a common LED driver to operate the LED lamps and/or a LED driver at each of the LED lamps.

Also comprised is an illuminating device comprising such a LED system and, where applicable, comprising further illuminating components.

Such a LED system has the advantage of being adaptable for a plurality of LED pitches. Also, no development of LED systems with customer specific LED pitches is required anymore. The LED pitch may be adjusted ex factory, alternatively a user may adjust the LED pitch himself.

A LED system may be preferred, in which the electrical connecting member comprises a common wire lead for the LED lamps of the set, in particular a ribbon cable. In order to connect the LED lamps to the wire lead and to tap into at least one conductor of the wire lead therewith, the LED lamps in each case preferably may comprise a disconnect/contacting connection, in particular a crimp/cut connection, for the (later) electrical connection to the wire lead. It may be particularly preferred when the disconnect/contacting connection of the LED lamp comprises a disconnecting member for disconnecting a conductor of the wire lead and two contact clamps, in particular cutting clamps, arranged on both sides thereof for contacting the disconnected conductor. Specifically preferred may be a contacting by means of so called crimping and/or disconnecting by means of cutting or punching. Alternatively, contacting may for example also be conducted by means of squeezing. The contacts to the disconnected ends are used to operate the LED lamp.

By means of the disconnect/contacting connection, in particular the crimp/cut connection, the advantage results, that the wire lead for connecting a LED lamp does not have to be prepared at the factory. Furthermore, the LED lamp may be connected at any arbitrary position not yet occupied by another LED lamp; the connection points at the wire lead are not specifically located in this case, but extend continuously across the available length of the wire lead. In other words, the connection points are selected arbitrarily across the available length of the wire lead, but are fixed subsequently. Furthermore, the crimp/cut method may establish a connection without a big effort, so that the LED system may also be configured by an end customer. In general, besides the crimp/cut method each other suitable contacting/disconnecting method may be used which is able to disconnect at least one conductor of the wire lead and to contact the disconnected ends for operation of the LED lamp.

It can be particularly advantageous if a contacting/disconnecting connection, specifically the crimp/cut connection, is formed for connecting to a supply line of the wire lead. In this case the LED lamp is connected to the supply line by disconnecting and contacting the supply line. A current flowing through this supply line hence is redirected through the LED lamp. The contacting/disconnecting connection or rather the crimp/cut connection may be formed such that it taps into further electrical conductors alternatively or additionally, for example a control lead. The connection for the most part is formed in a way that it cannot be removed anymore after an attachment to the wire lead.

The LED system further preferably may comprise at least one end piece with a connection, in particular a crimp connection, for connecting two supply lines of the wire lead. Thus, wire leads may be used, which do not have to be pre-tailored in length. This way a wire lead may be cut off at the respective end (for example shortly behind the last LED lamp) and be provided with the end piece. The length of the wire lead and the number of lamps are in fact limited in a commonly known manner by the maximum power output of the power source and by power losses.

However, a LED system may also be preferred, in which the electrical connecting member comprises at least one electrical conductor formed on a circuit board, wherein the connection points are formed as contacts at the at least one electrical conductor. In other words, a LED system formed on a circuit board may be preferred, in which connection points for LED lamps are formed at at least one trace routed on the circuit board. The at least one electrical conductor or trace, respectively, preferably may be part of a bus system.

In fact the LED lamps may also be coupled in parallel between different conductors of the circuit board; however, a LED system can be preferred, in which the connection points are respectively formed as contacts on both sides of a conductor disruption, in particular of a supply line. Thus, only one conductor is tapped by the LED lamp, consequently multiple LED lamps are electrically connected in series.

During assembly, one of multiple (discrete and predefined, respectively) connecting positions may thus be chosen for a LED lamp and the LED lamp may then be connected there.

In order to comprise a electrical circuit it may be necessary to bridge, by means of a electrical jumper, connection points of a conductor not in contact with a LED lamp and hence being open. Preferably, the connection points may be formed such that they may be contacted or bridged by means of commercial jumpers, for example in the form of pairs of jumper pins. The LED lamp is then provided with such jumpers at its contacts.

Preferably, the connection points may be inserted into a supply line and the LED system comprises a further supply line, wherein an end piece connects the two supply lines. The end piece preferably may also be formed in the form of a jumper.

The object is also achieved by means of a LED lamp having a disconnect/contacting connection, in particular a crimp/cut connection, for connecting to a wire lead, in particular to a ribbon cable.

Preferred may be a LED lamp, in which the crimp/cut connection has a disconnecting member for disconnecting a conductor of the wire lead and two contact clamps arranged on both sides thereof for contacting the disconnected conductor.

FIG. 1 sketchily shows components of a LED chain 1, that is to say a ribbon cable 2 illustrated in sections, two LED lamps 3, 4 and an end piece 5. The ribbon cable 2 is provided as a bus line and comprises multiple single conductors, of which only two supply lines 6, 7 having different electrical potentials are plotted for better clarity. The LED lamps 3, 4 are formed as single monochrome (for example also white) LEDs 8 here, the connectors of which are electrically connected with a respective crimp/cut connector 9. The end piece 5 has a electrical jumper 10 arranged for electrically connecting the two supply lines 6, 7. The number of two LED lamps 3, 4 is merely exemplary and may, inter alia dependent on the electrical power supplied and the length of the wire lead, also comprise more LED lamps, but also only one LED lamp where applicable.

Figure 2:
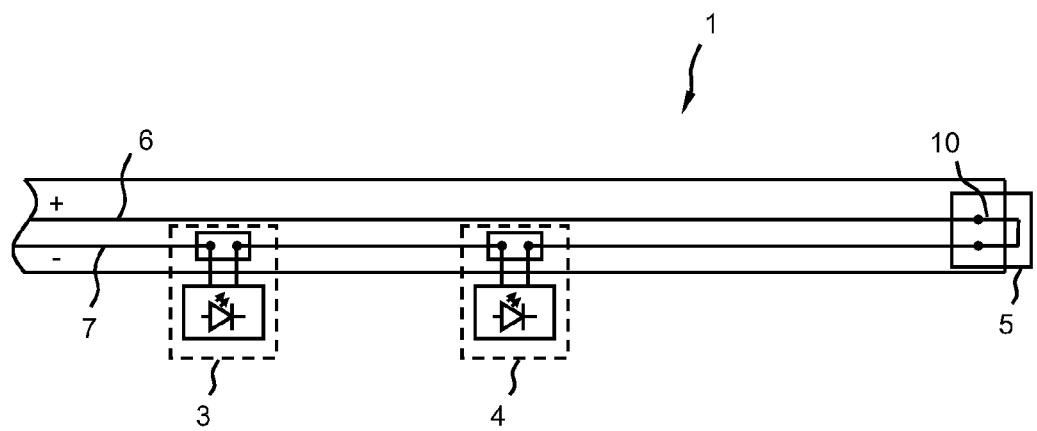
FIG. 2 sketchily shows the LED chain according to the first embodiment in its assembled state.

FIG. 2 shows the LED chain 1 in its assembled state. The LED lamps 3, 4 are now serially tapped into the supply line 7. This is done such that the supply line 7 is disconnected at the respective contacting position and is electrically contacted (tapped into) at the disconnected ends by means of the connector 9, and namely by means of crimping. As the two contacts of the connector 9 are connected with a respective one of the contacts (anode and cathode, respectively) of LED 8, LED 8 is tapped into the current flow in series.

Shown here is a right end of LED chain 1, which was produced by means of cutting off the wire lead 2 at a suitable position. In order to enable a current flow through the second supply line 7, the end piece 5 is crimped to both supply lines 6, 7 and connects the two. At the other end of the wire lead 2, not shown here, the LED chain 1 comprises a conventional power supply and, where applicable, a power control unit, for example a LED driver and a power connection including a transformer.

By means of this arrangement a LED distance of the serially arranged LED lamps 3, 4 and LEDs 8, respectively, may be arranged flexibly.

It is to be understood, that the invention is not limited to the exemplary embodiments shown.

Figure 3:
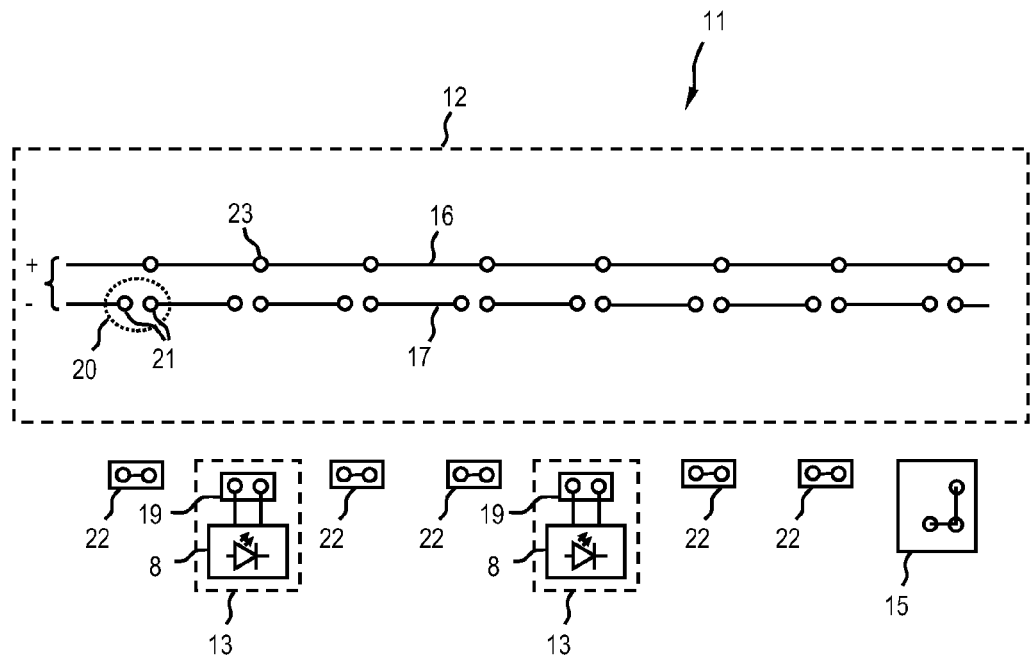
FIG. 3 sketchily shows components of a LED chain according to a second embodiment.

FIG. 3 sketchily shows components of a further LED chain 11, that is to say a circuit board 12, two LED lamps 13, 14, jumper bridges 22 and an end piece 15. Merely for improved clarity the circuit board 2 is illustrated with two supply lines 16, 17 of a bus structure sectionally applied thereon, the two supply lines being tapped into different electrical potentials. The LED lamps 13, 14 are formed as single monochrome (for example also white) LEDs 8 here, the connections of which are electrically connected to a respective jumper connector 19. The jumper connector 19 fits onto a connection point 20 exemplarily illustrated here in one of the supply lines 17. The (open) connection point 20 comprises two electrically separated jumper pins or jumper sockets 21, which are designed for electrically contacting the jumper connector 19. The jumper bridges 22 fit onto the connection points 20 as well and consequently form a electrical jumper between the jumper pins or jumper sockets 21 thereof. The end piece 15 comprises a electrical jumper 10, which is arranged for electrically connecting the two supply lines 16, 17.

The number of connection points 20, LED lamps 3, 4 and jumper bridges 22 and so on is merely exemplary.

Thus, in this device the bus structure arranged on the circuit board 12 and being variable by means of the jumpers may be arranged in a way that the desired LED distance is yielded. However, contrary to the first embodiment, this does not result in an arbitrary LED arrangement, but an arrangement following a certain pattern. In favor, the LED position is changeable by switching to other positions.

Figure 4:
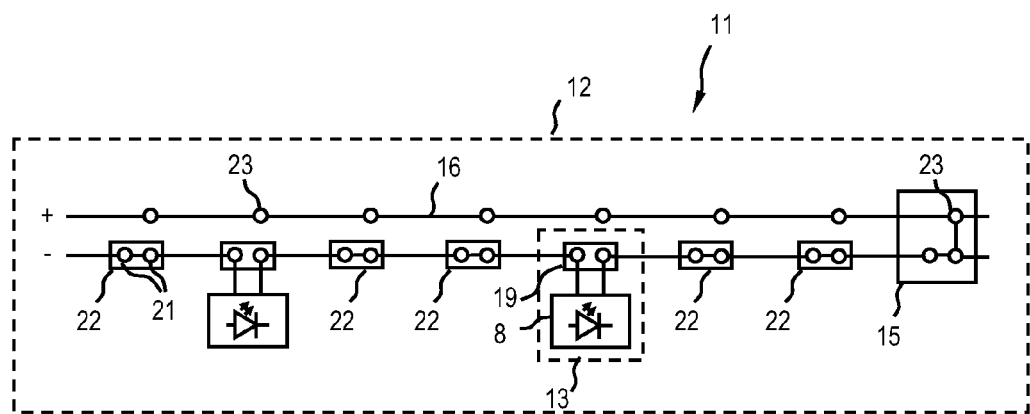
FIG. 4 sketchily shows the LED chain according to the second embodiment in its assembled state.

FIG. 4 sketchily shows a LED system 11 assembled using components of FIG. 3. Upon selection of a desired connection point 20 a LED lamp 13, 14 is attached to the respective jumper pins or jumper sockets 21 using its jumper connector 19. Once the desired LED lamps 13, 14 are attached, still unoccupied (open) connection points 20 are filled with jumper bridges 22 and thus bridged in order to enable a current flow through supply line 17.

End piece 15 is used for connecting the two supply lines 16, 17 tapped into different electrical potentials. In the embodiment shown, this end piece bridges the two jumper pins 21 of a connector 21 and moreover one of these jumper pins 21 bridges a jumper pin 23 electrically attached to the other supply line 16.

Figure 5:
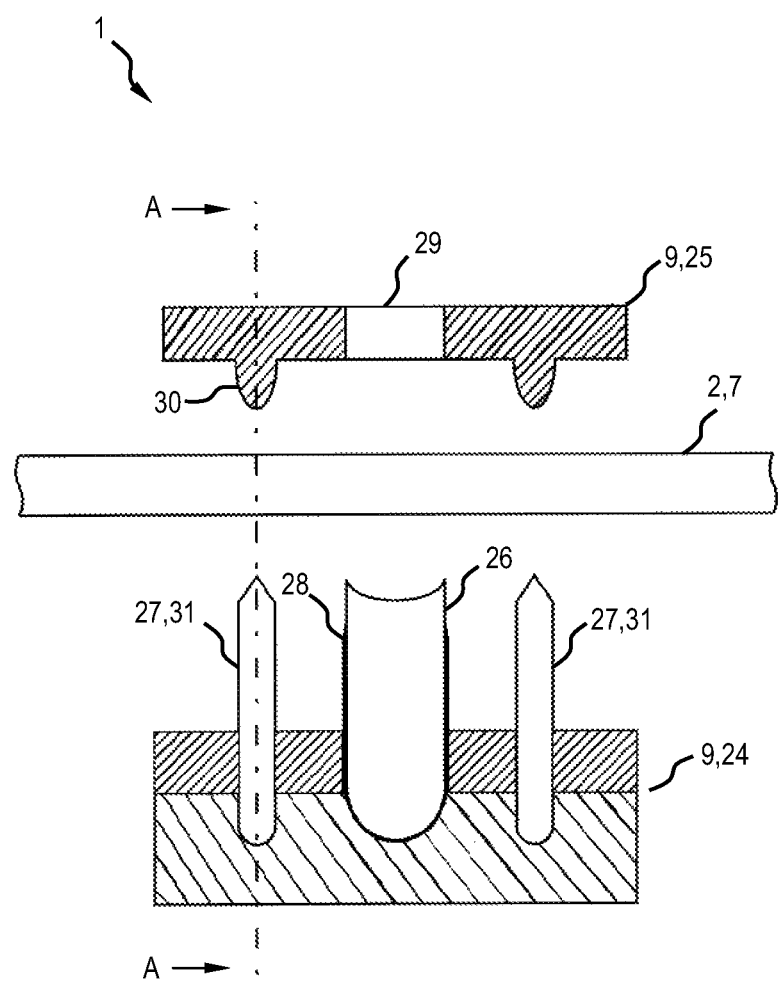
FIG. 5 shows as a sectional view in lateral view a cut/crimp connector of a LED lamp according to the first embodiment with a respective wire lead section.

FIG. 5 in side view shows in more detail a cut/crimp connector 9 according to FIG. 1 together with a respective section of the wire lead 2 at a supply line 7.

The cut/crimp connector 9 has a socket 24 and a cap 25 at opposite sides of supply line 7. The socket 24 has a cutting member or punching member 26, respectively, and on both sides adjacent thereto a respective cutting clamp 27 in the form of an inverted 'U', whose free, tapered blades 31 extend upward from socket 24. The cutting member 26 is surrounded by an electrical isolation 28 arranged opposite to socket 24. The conductive cutting clamps 27 serve as electrical contacts for the LED lamp and are electrically connected to a respective connection (anode or cathode) of the LED (not shown). Cap 25 comprises a feed through 29, which, with respect to the ribbon cable 2, is arranged opposite to the cutting member 26. The cap 25 further comprises protrusions 30, which are arranged opposite to the cutting clamps 27 of socket 24.

Figure 6:
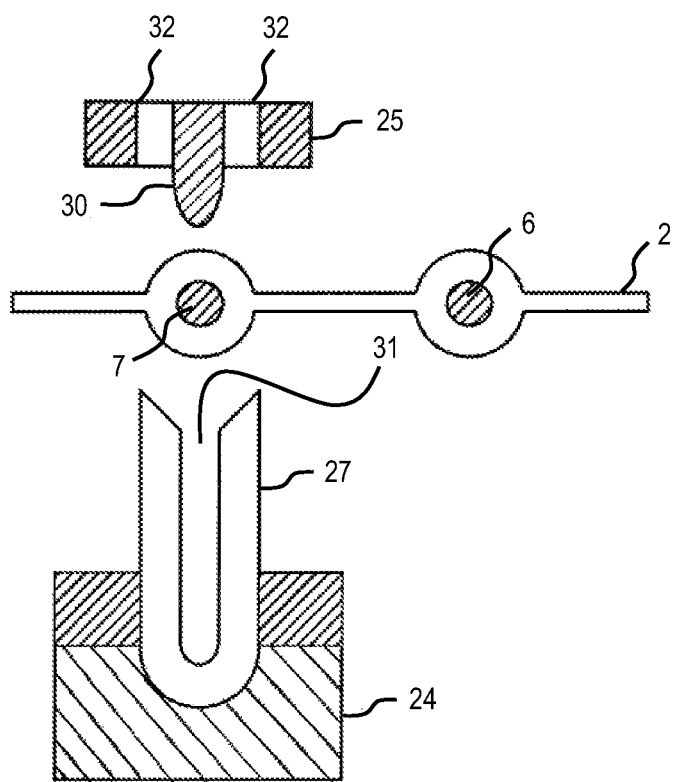
FIG. 6 shows the cut/crimp connector of FIG. 5 as a sectional view in front view along a axis A-A in FIG. 5.

FIG. 6 shows the arrangement of FIG. 5 in front view along intersecting line A-A through a cutting clamp 27. The width of the protrusions 30 fits between the blades 31 of the respective cutting clamp 27. Adjacent to protrusion 30 two feed troughs 32 to feed through the blades 31 of the respective cutting clamp 27 are arranged in cap 25.

Figure 7:
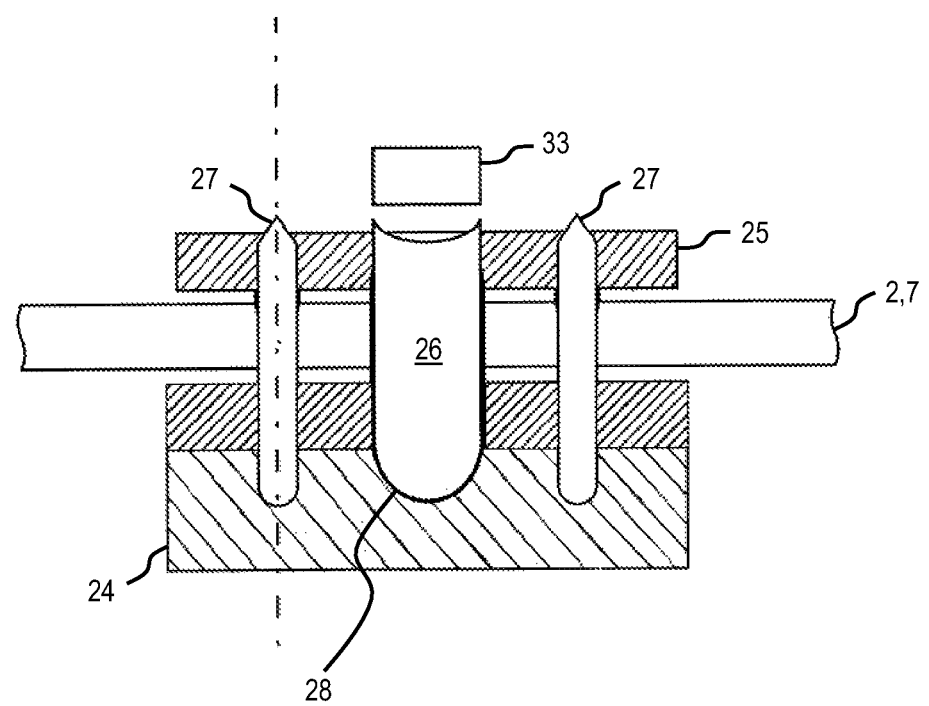
FIG. 7 shows the cut/crimp connector of and analogous with FIG. 5 in its assembled state.
Figure 8:
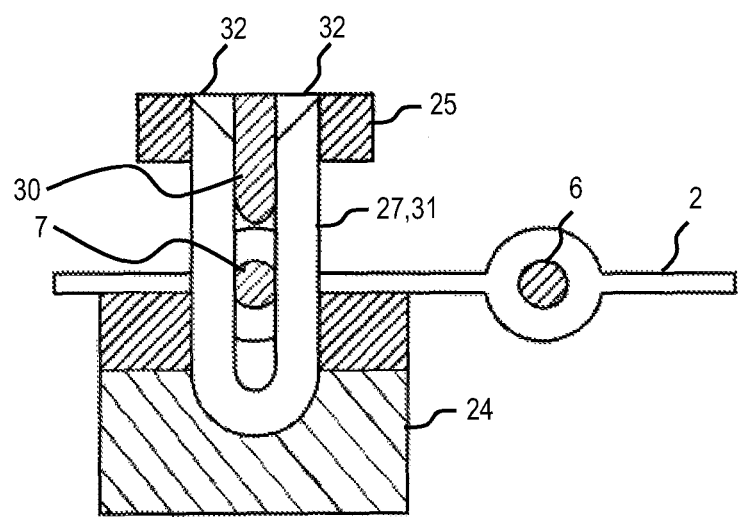
FIG. 8 shows the cut/crimp connector of and analogous with FIG. 6 in its assembled state.

FIG. 7 and FIG. 8 show the section of LED chain 1 analogous with FIG. 5 and FIG. 6, respectively, in its assembled state. For assembly, socket 24 and cap 25 arranged on opposite sides of ribbon cable 2 are pressed against each other, for example by means of a force applied by fingers, a gripper or a press. In doing so, spikes of the cutting edge 26 aid in attaching the socket 24 onto the ribbon cable 2. By means of compressing cap 25 and socket 24, firstly the cutting edge 26 is pressed through the respective feed through 30 in cap 25 and cuts or punches away a respective piece 33 of the wire lead 2 and hence also of supply line 7 by means of its upper cutting edges (without numerals). Secondly, by doing so the protrusions 30 are set against the cutting clamps 27, and consequently spikes of the cutting clamps 27 are fed through their respective feed throughs 32. At the same time protrusion 30 presses the conductor 7 between the blades 31 of the respective cutting clamp 27. The blades 31 are comprised with cutting edges at their opposite sides, which have a distance somewhat smaller than the width of supply line 7. Thereby, by pressing conductor 7 into the cutting clamp 27 the isolation thereof is ripped by the cutting edges and conductor 7 itself is pressed against the electrically conductive cutting clamps 27, whereby a sufficiently large and secure electrical contact is achieved. Altogether, conductor 7 is thus disconnected and tapped at the open ends. Thereby a current may flow from one end of supply line 7 through a respective cutting clamp 27 to a connection of a LED (or a LED cluster), and return through the LED via the other connection of the LED and the other cutting clamp 27 towards the other end of line 7.

It is to be understood, that the present invention is not limited to the exemplary embodiments specified. For instance, the connection points may be arranged on multiple supply lines. As well, connection points may additionally or alternatively be arranged on others than supply lines, for example on control lines. In the case of a disconnect/contacting connection multiple supply lines or lines other than supply lines may be tapped.

REFERENCE NUMERALS

1 LED chain
2 ribbon cable
3 LED lamp
4 LED lamp
5 end piece
6 supply line
7 supply line
8 LED
9 crimp/cut connector
10 electrical jumper
11 LED chain
12 circuit board
13 LED lamp
14 LED lamp
15 end piece
16 supply line
17 supply line
19 jumper connector
20 connection point
21 jumper pin
22 jumper bridge
23 jumper pin/jumper socket
24 socket
25 cap
26 cutting member
27 cutting clamp
28 isolation
29 feed through
30 protrusion
31 blade
32 feed throughs
33 punched section of wire lead

What is claimed is:

1. An LED system with a set consisting of multiple LED lamps and an integrally formed electrical connecting member common to the LED lamps,
    wherein the electrical connecting member comprises multiple connection points for selectively contacting a respective LED lamp or an electrical jumper, wherein the electrical connecting member comprises at least one electrical conductor formed on a circuit board,
    wherein the connection points are formed as contacts on the at least one electrical conductor, wherein the connection points are formed as respective contacts on both sides of a conductor disruption,
    wherein the connection points of a conductor not contacted by an LED lamp are bridgeable by means of the electrical jumper,
    wherein the connection points are positioned in a supply line and the LED system comprises a further supply line,
    wherein an end piece connects the two supply lines, and
    wherein at least two supply lines are arranged on the same substrate.

2. The LED system according to claim 1, wherein the connection points are formed as respective contacts on both sides of a supply line.

3. A method for assembling an LED system or an LED chain, comprising at least one integrally formed electrical connecting member and multiple LED lamps,
    wherein the electrical connecting member comprises multiple connection points for selectively contacting a respective LED lamp or an electrical jumper, and
    wherein the method comprises the following steps:
    selecting a connection position for an LED lamp on the electrical connecting member;
    and connecting an LED lamp at the selected connection position on the electrical connecting member,
    wherein the electrical connecting member comprises a circuit board with an electrical conductor formed thereon,
    wherein the connection points are formed as contacts on the at least one electrical conductor and the step of selecting a connection position for an LED lamp at the electrical connecting member comprises selecting one of multiple predefined connection points,
    further comprising the step of: bridging of open connection points not connected to LED lamps by an electrical jumper,
    wherein the connection points are positioned in a supply line and the LED system comprises a further supply line,
    wherein an end piece connects the two supply lines, and
    and wherein at least two supply lines are arranged on the same substrate.

4. The LED system according to claim 1, wherein the two supply lines are arranged in parallel on the same substrate.

5. The LED system according to claim 1, wherein the two supply lines are lines of a common bus system.

6. The LED system according to claim 1, wherein the two supply lines are being tapped into different electrical potentials.

7. The LED system according to claim 1, wherein only a first of the two supply lines comprises the multiple connection points.

8. The LED system according to claim 7, wherein the multiple connection points each comprise two juniper pins and wherein a second of the two supply lines comprises several single/non-bridging jumper pins.

9. The LED system according to claim 8, wherein the two supply lines are connected by an end piece which end piece bridges the two jumper pins of one connection point of the first supply line as well as one of the two jumper pins of the one connection point and one single jumper pin of the second supply line.

* * * * *